United States Patent
Li et al.

(10) Patent No.: US 10,276,520 B2
(45) Date of Patent: Apr. 30, 2019

(54) SWITCH CIRCUIT PACKAGE MODULE

(71) Applicant: Delta Electronics (Shanghai) Co., Ltd., Shanghai (CN)

(72) Inventors: Zeng Li, Shanghai (CN); Shou-Yu Hong, Shanghai (CN); Jian-Hong Zeng, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/667,640

(22) Filed: Aug. 3, 2017

(65) Prior Publication Data

US 2017/0330846 A1    Nov. 16, 2017

Related U.S. Application Data

(60) Division of application No. 14/798,484, filed on Jul. 14, 2015, now Pat. No. 9,754,871, which is a
(Continued)

(30) Foreign Application Priority Data

Oct. 31, 2012    (CN) .......................... 2012 1 0429620

(51) Int. Cl.
*H01L 23/66*    (2006.01)
*H01L 23/528*    (2006.01)
(Continued)

(52) U.S. Cl.
CPC ............ *H01L 23/66* (2013.01); *G11B 5/4873* (2013.01); *H01L 23/49562* (2013.01);
(Continued)

(58) Field of Classification Search
CPC .......................... H01L 23/5222; H01L 23/642
See application file for complete search history.

(56) References Cited

U.S. PATENT DOCUMENTS

| 5,859,632 A | 1/1999 | Ito |
| 6,157,242 A | 12/2000 | Fukui |
(Continued)

FOREIGN PATENT DOCUMENTS

| CN | 1812235 A | 8/2006 |
| CN | 101783587 A | 7/2010 |
(Continued)

*Primary Examiner* — Kenneth Parker
*Assistant Examiner* — Long H Le
(74) *Attorney, Agent, or Firm* — CKC & Partners Co., LLC

(57) ABSTRACT

A switch circuit package module includes a semiconductor switch unit and a capacitor unit. The semiconductor switch unit includes a first semiconductor switch element and a second semiconductor switch element. The first semiconductor switch element includes sub micro-switch elements, each sub micro-switch element configured with a drain electrode and a source electrode. The second semiconductor switch element includes sub micro-switch elements, each sub micro-switch element configured with a drain electrode and a source electrode. The capacitor unit includes a plurality of capacitors. The semiconductor switch unit includes a plurality of common electrodes, each common electrode connects the source electrode of one sub micro-switch element in the first semiconductor switch element with the drain of one sub micro-switch element in the second semiconductor switch element and is disposed adjacent to at least one drain electrode from the first semiconductor switch element or one source electrode from the second semiconductor switch element.

3 Claims, 16 Drawing Sheets

Related U.S. Application Data continuation-in-part of application No. 13/760,079, filed on Feb. 6, 2013, now Pat. No. 9,111,928.

(51) Int. Cl.

| | | |
|---|---|---|
| *H01L 23/522* | (2006.01) | |
| *H01L 23/64* | (2006.01) | |
| *H01L 29/92* | (2006.01) | |
| *H01L 27/088* | (2006.01) | |
| *H01L 23/495* | (2006.01) | |
| *H01L 23/538* | (2006.01) | |
| *H01L 23/00* | (2006.01) | |
| *G11B 5/48* | (2006.01) | |
| *H01L 21/56* | (2006.01) | |

(52) U.S. Cl.
CPC .. *H01L 23/49575* (2013.01); *H01L 23/49589* (2013.01); *H01L 23/528* (2013.01); *H01L 23/5222* (2013.01); *H01L 23/5389* (2013.01); *H01L 23/642* (2013.01); *H01L 24/24* (2013.01); *H01L 24/82* (2013.01); *H01L 27/088* (2013.01); *H01L 29/92* (2013.01); *H01L 21/568* (2013.01); *H01L 24/73* (2013.01); *H01L 2224/04105* (2013.01); *H01L 2224/24137* (2013.01); *H01L 2224/24245* (2013.01); *H01L 2224/32145* (2013.01); *H01L 2224/32245* (2013.01); *H01L 2224/33181* (2013.01); *H01L 2224/48091* (2013.01); *H01L 2224/48137* (2013.01); *H01L 2224/48247* (2013.01); *H01L 2224/73265* (2013.01); *H01L 2224/82039* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01); *H01L 2924/19041* (2013.01); *H01L 2924/19042* (2013.01); *H01L 2924/19104* (2013.01); *H01L 2924/19105* (2013.01); *H01L 2924/3011* (2013.01); *H01L 2924/30107* (2013.01)

(56) References Cited

U.S. PATENT DOCUMENTS

| | | | | |
|---|---|---|---|---|
| 7,071,765 | B2 * | 7/2006 | Kamijo | H02M 3/07 |
| | | | | 327/536 |
| 7,248,483 | B2 | 7/2007 | West | |
| 7,459,965 | B2 | 12/2008 | Sugano | |
| 2004/0089934 | A1 | 5/2004 | Shimoida et al. | |
| 2009/0175014 | A1 | 7/2009 | Zeng et al. | |
| 2009/0231887 | A1 * | 9/2009 | Ye | H02M 3/33569 |
| | | | | 363/21.02 |
| 2009/0256245 | A1 | 10/2009 | Liu et al. | |
| 2011/0068832 | A1 * | 3/2011 | Chen | H03K 17/04123 |
| | | | | 327/109 |
| 2011/0291236 | A1 | 12/2011 | Hayashi et al. | |

FOREIGN PATENT DOCUMENTS

| | | |
|---|---|---|
| CN | 101820227 A | 9/2010 |
| CN | 101990709 A | 3/2011 |
| CN | 102739069 A | 10/2012 |
| TW | 200931777 A | 7/2009 |

* cited by examiner

SWITCH CIRCUIT PACKAGE MODULE

RELATED APPLICATIONS

This application is a Divisional of U.S. application Ser. No. 14/798,484, filed on Jul. 14, 2015, which is a continuation-in-part application of U.S. application Ser. No. 13/760,079, filed on Feb. 6, 2013, now U.S. Pat. No. 9,111,928, which claims priority to Chinese Application Serial Number 201210429620.8, filed Oct. 31, 2012. The entire disclosures of all the above applications are hereby incorporated by reference herein.

BACKGROUND

Field of Disclosure

The disclosure relates to a switch circuit. More particularly, the disclosure relates to a switch circuit package module.

Description of Related Art

In recent years, since both of industrial electronic products and general electronic products are required to have a lower power loss during the operation, it becomes an important issue that how to make the switch circuits in the electronic products work more efficiently so as to decrease the losses of the electronic products.

In the switch circuit, when different switches work alternately, a process of switching the switches will make the energy stored in a parasitic inductor on a commutation loop to be consumed on the circuit, and since the switch circuit generally has a higher switch frequency, a larger switch loss will be generated. In addition, if the switch circuit is made in the form of chip, then the switch circuit has a higher current harmonic, which will lead to a non-uniform distribution of the current on the chip, so as to generate an additional chip loss. Since a larger parasitic inductance in the loop often leads to non-ideal efficiency of the switch circuit, a capacitor is usually added into the switch circuit, so as to shrink an equivalent inductance and reduce the loss.

There are many conventional methods used to reduce the loss of the switch circuit. However, under a high frequency operating condition, the conventional methods can still lead to the problems such as apparent non-uniform distribution of the current on the chip due to the switch circuit having a higher current harmonics and low utilization of the chip due to the non-uniform distribution of the current when the switch is at a transient state.

SUMMARY

An aspect of the disclosure relates to a switch circuit package module including a semiconductor switch unit and a capacitor unit. The semiconductor switch unit includes a first semiconductor switch element and a second semiconductor switch element. The first semiconductor switch element includes a plurality of sub micro-switch elements, each sub micro-switch element configured with a drain electrode and a source electrode. The second semiconductor switch element includes a plurality of sub micro-switch elements, each sub micro-switch element configured with a drain electrode and a source electrode. The capacitor unit includes a plurality of capacitors. The semiconductor switch unit includes a plurality of common electrodes, each common electrode connects the source electrode of one sub micro-switch element in the first semiconductor switch element with the drain of one sub micro-switch element in the second semiconductor switch element and is disposed adjacent to at least one drain electrode from the first semiconductor switch element or one source electrode from the second semiconductor switch element, such that when the capacitors are configured to cooperate with the sub micro-switch element, impedances of multiple commutation loops between the capacitors and the sub micro-switch element are close to or the same with each other.

DETAILED DESCRIPTION

A detailed description is made hereinafter by taking embodiments and cooperating with the accompanying drawings. However, the embodiments described are not intended to limit the scope of the disclosure, while the description of a structural operation is not intended to limit the order of implementation. Any device with equivalent functions that is generated by a structure recombined by components shall fall into the scope of the disclosure. Additionally, the drawings are only used for illustration and are not drawn to scale.

As used herein, the terms "about", "approximately" or "roughly" generally refers to the error or scope of the quantity which is within a range of 20%, preferably within a range of 10%, and more preferably within a range of 5%. If no specific description is provided herein, then all the quantities mentioned herein are considered as approximate values, e.g., the error or scope being referred to by the terms "about", "approximately" or "roughly" or other approximate values.

Additionally, as used herein, both of the terms "couple" or "connect" can refer to the mutual physical contact or electrical contact performed directly or indirectly between two or more components. The terms "couple" or "connect" also can refer to the mutual operation or action between two or more components.

Figure 1A:
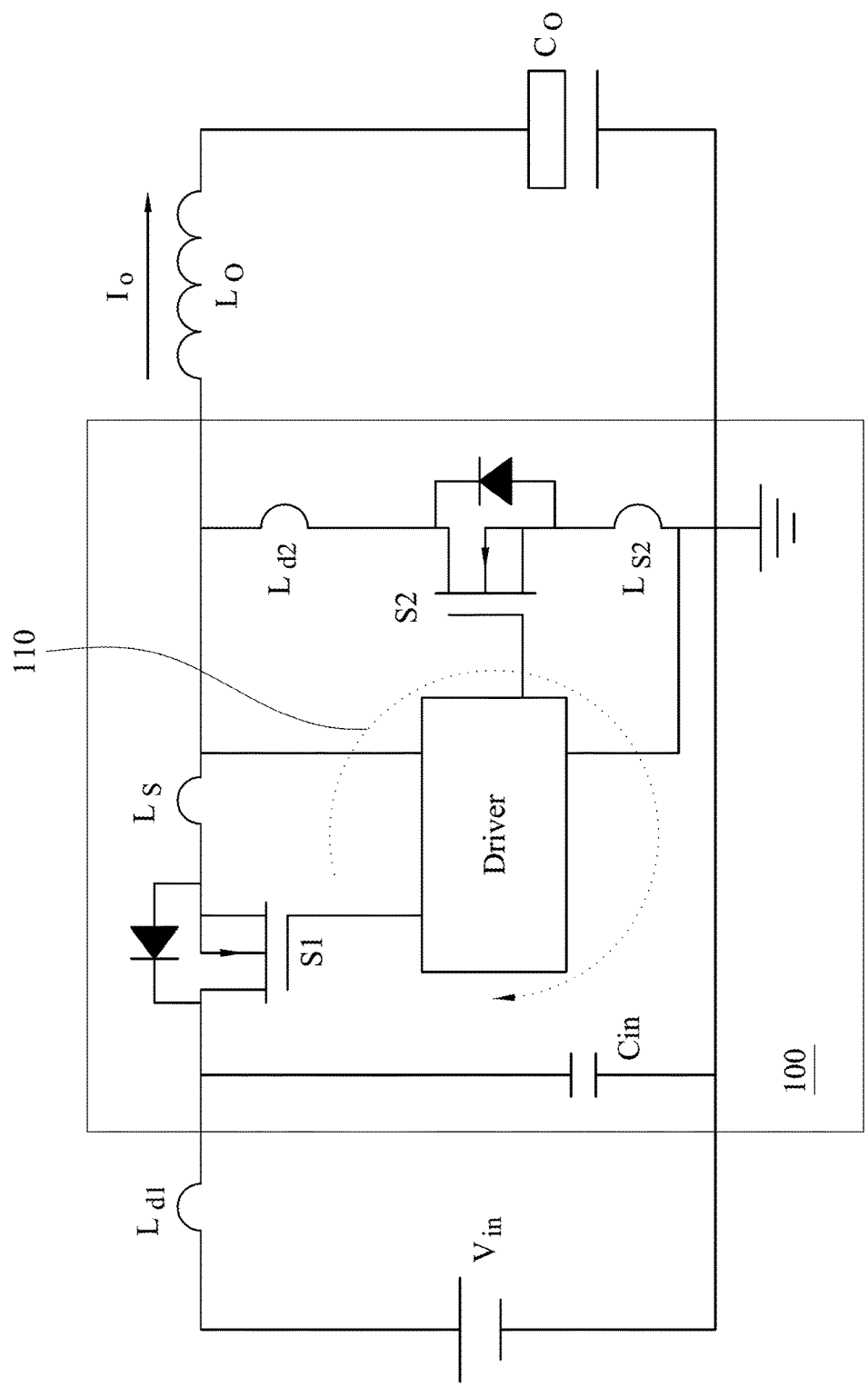
FIG. 1A is a schematic diagram illustrating a switch circuit according to an embodiment of the disclosure.

FIG. 1A is a schematic diagram illustrating a switch circuit according to an embodiment of the disclosure. As shown in FIG. 1A, a switch circuit 100 includes two switches S1 and S2, and the switches S1 and S2 are controlled by a driver and switched alternatively, so as to perform a switch process. Specifically, when the switch S1 is switched on, the current flows to an output inductance $L_O$ and an output capacitor $C_O$ through the switch S1; then, when the switch S1 is switched off, a voltage cross the switch S1 (such as a source-drain voltage) is raised, and an voltage cross the switch S2 (such as a source-drain voltage) is reduced. At this time, the current flowing through the switch S1 is transformed to flow to the switch S2. Afterwards, when the switch S2 is switched on, the current flows to the output inductance $L_O$ and the output capacitor $C_O$ through the switch S2; then, when the switch S2 is switched off and the switch S1 is switched on, the voltage cross the switch S2 is raised, and the voltage cross the switch S1 is reduced. At this time, the current flowing through the switch S2 is transformed to flow to the switch S1.

When the above-mentioned switch circuit 100 operates in a switch state, the current is switched between branch paths constituted by a capacitor Cin and the switches S1 and S2. As shown in FIG. 1A, the current is transformed from the branch path corresponding to the switch S2 to the branch path constituted by the capacitor Cin and the switch S1, and the loop constituted by the two branch paths is a commutation loop 110.

Figure 1B:
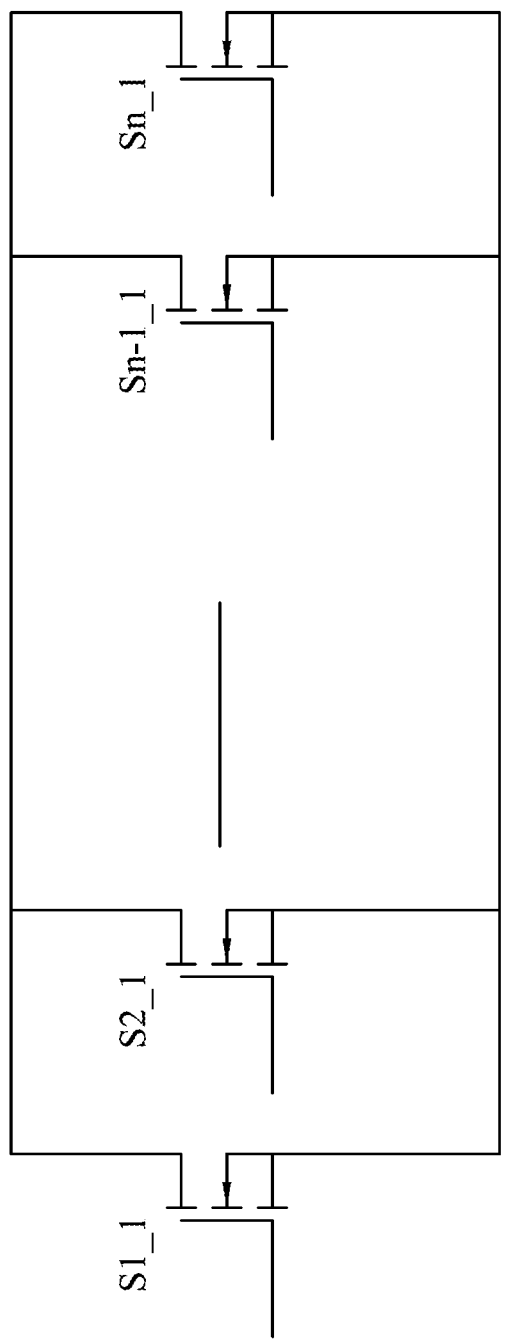
FIG. 1B is a schematic diagram illustrating a switch equivalent circuit having multiple switches juxtaposed.

Referring to FIG. 1B, the equivalent circuit of the switch S1 or the switch S2 in FIG. 1A is as shown in FIG. 1B. As shown in FIG. 1B, the switch S1 or the switch S2 in FIG. 1A includes multiple sub micro-switch elements S1_1, S2_1, . . . , Sn_1 which are juxtaposed. Compared to FIG. 1B, the equivalent circuit shown in FIG. 1C may further include a capacitor C and inductances Ld1-Ld(n−1) and Ls1-Ls(n−1). The capacitor C is connected in parallel to the above-mentioned equivalent circuit. The Ld1-Ld(n−1) are parasitic inductances of a metal wiring layer, solder and metal conductive plate on an upper surface of a chip. The Ls1-Ls(n−1) are parasitic inductances of a metal wiring layer, solder and metal substrate on a lower surface of the chip. The Ld and Ls are parasitic inductances of metal conductors between the chip and the capacitor C.

Figure 1C:
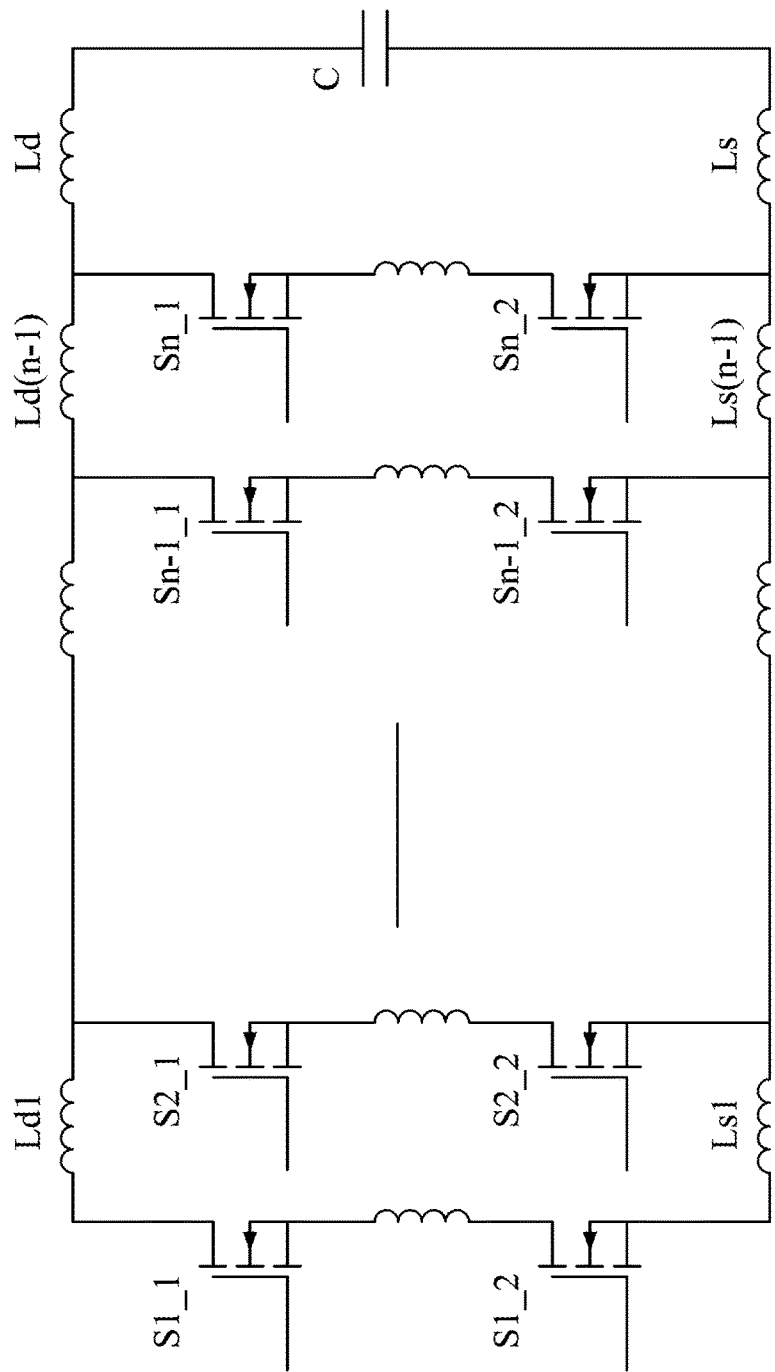
FIG. 1C is a schematic diagram illustrating a switch equivalent circuit having parasitic components.

It can be seen form the equivalent circuit shown in FIG. 1C that, compared to parasitic impedances on the commutation loop formed by the right-side MOSFET cells closer to the capacitor C and the capacitor C, parasitic impedances on the commutation loop formed by the left-side MOSFET cells away from the capacitor C and the capacitor C are larger. Therefore, under the condition that the cells in the chip are paralleled and switched on, the current density of the left-side cells will be less than the current density of the right-side cells.

The chip surface metal impedances lead to the non-uniform distribution of the current, and thus it apparently causes that a switch-on resistance $R_{ds,on}$ of the MOSFET is increased and more switch-on losses are generated. Due to the existence of the inductive impedances, the higher the frequency is, the larger the impedances are, so that the current distribution is also more non-uniform. Particularly at the switch time, since the speed is very quick, which is equivalent to the condition that the operating frequency is very high and the current distribution is very non-uniform, only a part of the MOSFET cells can participate in action at this time, such that the switch speed of the MOSFET is reduced and more switch-on losses are generated.

In view of the above, from a package perspective, the essential factor of affecting the switch circuit efficiency at least has the following three kinds: (A) the parasitic inductances of the commutation loops; (B) the current distribution of the MOSFET cells during the switch-on process, in which one quantifiable concept may be used for defining the current distribution density in the cells, i.e., the switch-on resistance $R_{ds,on}$ during the switch-on process; and (C) the switch process which is subjected to the factors such as the parasitic inductances on the cell surface, such that the number of the cells actually participating in the switch action is reduced, in which the utilization of the MOSFET semiconductor chip may be used for defining the number of the MOSFET cells actually participating in the switch action herein.

Embodiments of the disclosure described below primarily provide a package module of the switch circuit integrated with the capacitor, so as to reduce the loss of the switch circuit during the operation and make the current distribution thereon uniform, to enhance the utilization of the switch or improve the efficiency of the switch circuit.

Figure 2:
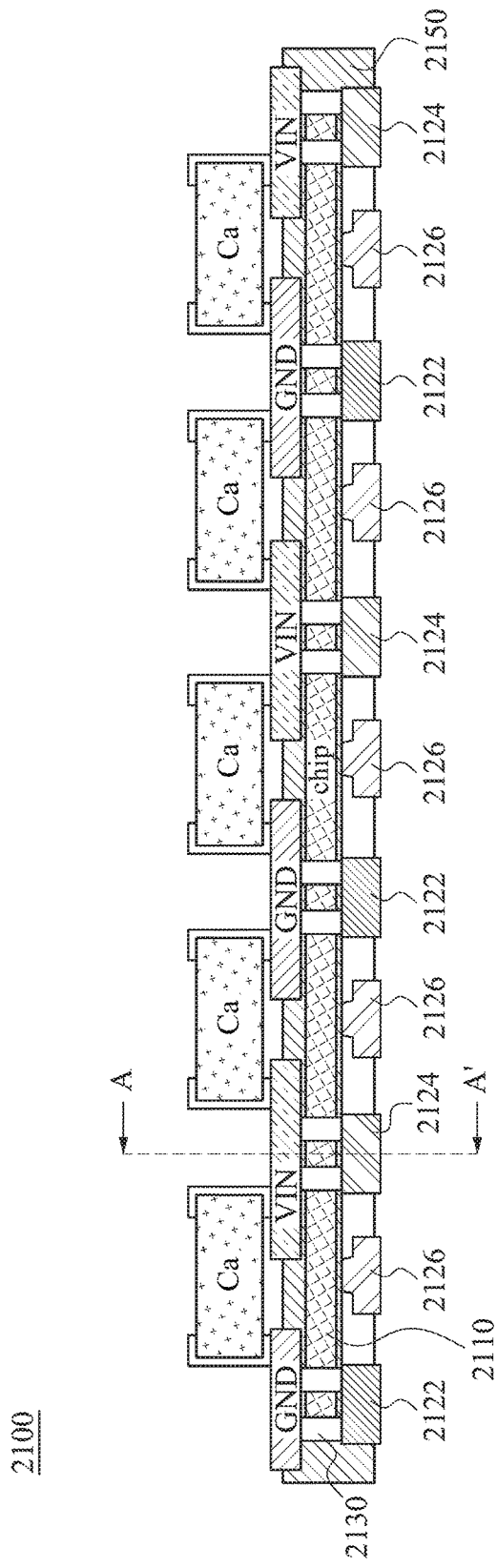
FIG. 2 is a schematic cross-section diagram illustrating a switch circuit package module according to an embodiment of the disclosure.

FIG. 2 is a schematic cross-section diagram illustrating a switch circuit package module according to an embodiment of the disclosure. As shown in FIG. 2, the switch circuit package module 2100 includes a semiconductor switch unit 2110 (i.e., the chip as shown in FIG. 2) and a capacitor unit. The semiconductor switch unit 2110 includes a first semiconductor switch element and a second semiconductor switch element. The first semiconductor switch element includes a plurality of sub micro-switch elements, and each sub micro-switch element is configured with a drain electrode and a source electrode. The second semiconductor switch element includes a plurality of sub micro-switch elements, and each sub micro-switch element is configured with a drain electrode and a source electrode. The capacitor unit includes a plurality of capacitors Ca. The semiconductor switch unit 2110 includes a plurality of common electrodes.

Each common electrode connects the source electrode of one sub micro-switch element in the first semiconductor switch element with the drain electrode of one sub micro-switch element in the second semiconductor switch element and is disposed adjacent to at least one drain electrode from the first semiconductor switch element or one source electrode from the second semiconductor switch element, such that when the capacitors Ca are configured to cooperate with the sub micro-switch element, impedances of multiple commutation loops between the capacitors Ca and the sub micro-switch element are close to or the same with each other. In another embodiment, each common electrode is disposed between one drain electrode of the first semiconductor switch element and one source electrode of the second semiconductor switch element.

In yet another embodiment, the switch circuit package module 2100 further includes a redistribution layer configured with via 2130, pads and metal layer. The semiconductor switch unit 2110 is embedded in the redistribution layer. The pads comprise a first group of pads 2122, 2124, 2126 and a second group of pads GND, VIN which are located in two opposite surfaces of the redistribution layer respectively. The first group of pads 2122, 2124, 2126 lead out the drain electrodes of the first semiconductor switch element, the source electrodes of the second semiconductor switch element and the common electrodes of the semiconductor switch unit through the metal layer. The second group of pads GND, VIN lead out the drain electrodes of the first semiconductor switch element and the source electrodes of the second semiconductor switch element through the metal layer and via 2130. In still another embodiment, the pad GND and the pad VIN are disposed in turn. Specifically, the pad GND and the pad VIN are arranged in an order of the pad GND, the pad VIN, the pad GND, the pad VIN, and so on. In yet another embodiment, the number of the pad GND and the pad VIN is but not limited to six. If the number of the pad GND and the pad VIN employed in the switch circuit package module 2100 is greater than or equal to three, electrical performance of the switch circuit package module 2100 can be enhanced.

In still another embodiment, the pads 2122, 2124, 2126 of FIG. 2 are disposed on one side of the semiconductor switch unit 2110 (i.e., the bottom side of the semiconductor switch unit 2110), and the capacitors Ca of FIG. 2 are disposed on another side of the semiconductor switch unit 2110 (i.e., the upper side of the semiconductor switch unit 2110). In addition, the semiconductor switch unit 2110 is coupled to the pads 2122, 2124, 2126 directly such that the thermal conductivity and the electrical conductivity of the switch circuit package module 2100 are enhanced.

In one embodiment, the semiconductor switch unit 2110 of FIG. 2 is covered by the build-up material layer 2150. In another embodiment, the build-up material layer 2150 can be composed of but not limited to isolation material. Due to the property of the build-up material layer 2150, the build-up material layer 2150 can further protect the semiconductor switch unit 2110 from damage.

Figure 3:
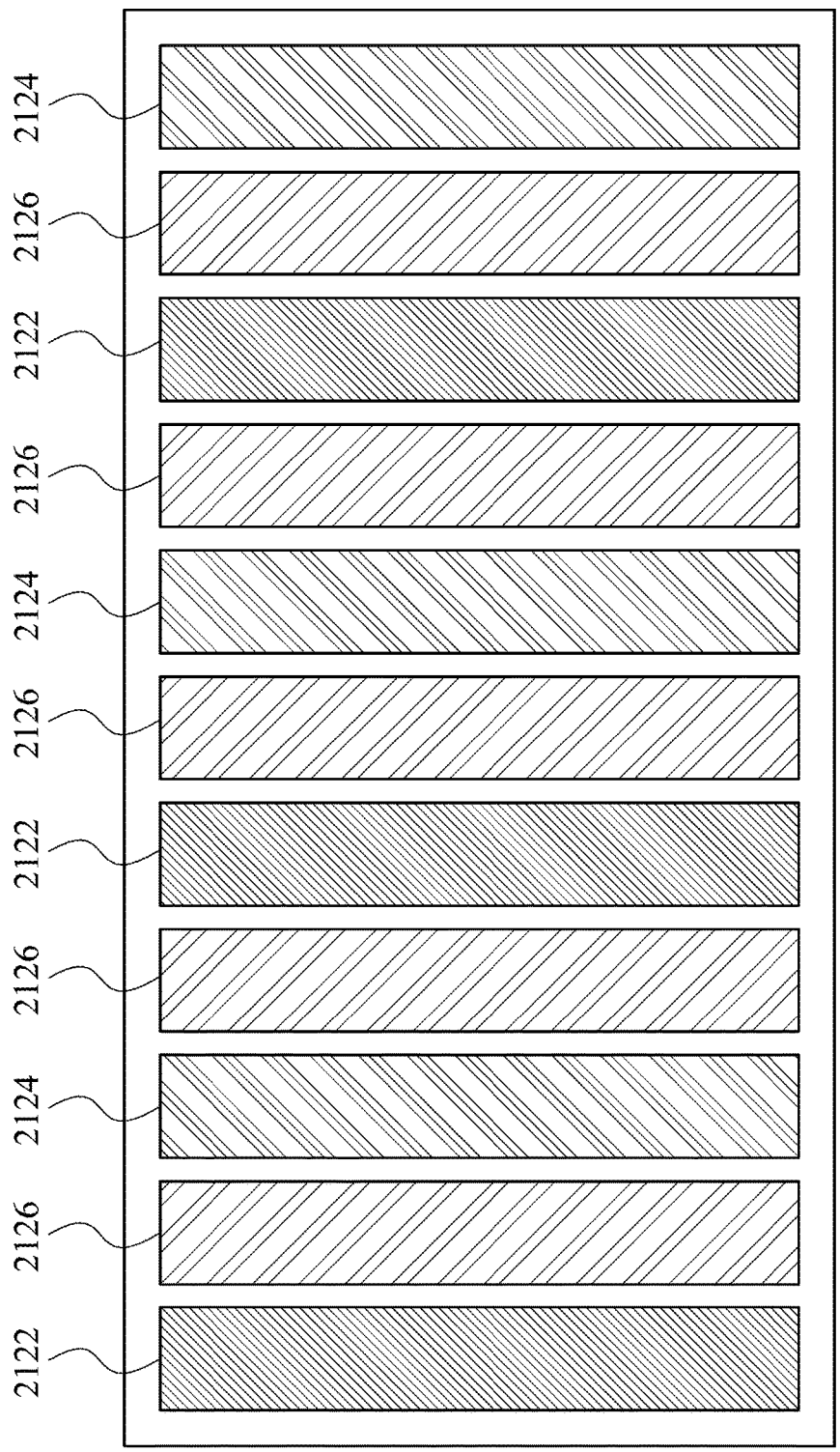
FIG. 3 is a schematic bottom diagram illustrating the switch circuit package module as shown in FIG. 2 according to an embodiment of the disclosure.

For facilitating the understanding of the switch circuit package module 2100, reference is now made to FIG. 3 which is a schematic bottom diagram illustrating the switch circuit package module 2100 as shown in FIG. 2 according to an embodiment of the disclosure. As shown in FIG. 3, the first group of pads 2122, 2124, 2126 are arranged in an order of the pad 2122, the pad 2126, the pad 2124, the pad 2126, and so on. Therefore, it is clearly that the pad 2126 corresponding to the foregoing common electrode is disposed adjacent to the pad 2124 corresponding to the drain electrode of the first semiconductor switch element or the pad 2122 corresponding to the source electrode of the second semiconductor switch element, and such disposition can enhance electrical performance of the switch circuit package module 2100, for example, the current on the switch circuit package module 2100 is distributed uniformly. In another embodiment, the number of the pads 2122, 2124, 2126 is but not limited to eleven. If the number of the pads employed in the switch circuit package module 2100 is greater than or equal to five, electrical performance of the switch circuit package module 2100 can be enhanced.

In one embodiment, the semiconductor switch unit 2110 is a one integral chip. The first semiconductor switch element and the second semiconductor switch element are integrated into the one integral chip.

Figure 4:
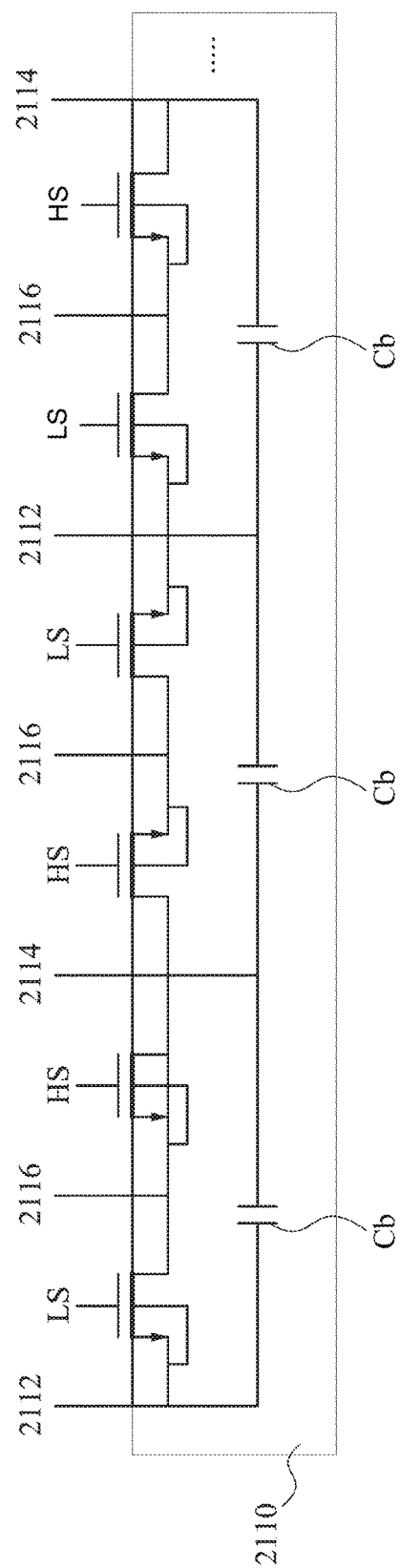
FIG. 4 is a schematic diagram of a semiconductor switch unit of the switch circuit package module as shown in FIG. 2 according to an embodiment of the disclosure.

FIG. 4 is a schematic diagram of a semiconductor switch unit of the switch circuit package module as shown in FIG. 2 according to an embodiment of the disclosure. As shown in FIG. 4, the semiconductor switch unit 2110 includes at least a first semiconductor switch element, at least a second semiconductor switch element, a plurality of pins 2112, 2114, and a plurality of common pins 2116. With respect to structure, the pins 2114 are coupled to the drain electrode of the first semiconductor switch element, and the pins 2112 are coupled to the source electrode of the second semiconductor switch element. The common pins 2116 are coupled to the source electrode of the first semiconductor switch and the drain electrode of the second semiconductor switch element. The common pins 2116 are disposed adjacent to the pin 2112 or the pin 2114. The pins 2112, 2114 and the common pins 2116 are arranged in an order of the pin 2112, the pin 2116, the pin 2114, the pin 2116, and so on.

In another embodiment, the semiconductor switch unit 2110 is a one integral chip. The semiconductor switch unit 2110 further comprises a plurality of capacitors integrated in. In actual application, the capacitors are micro-capacitors Cb and each micro-capacitor Cb comprises two electrodes. The two electrodes of each micro-capacitors Cb are electrically connected with the drain electrode of the first semiconductor switch element and the source electrode of the second semiconductor switch element respectively. Since the micro-capacitors Cb are integrated in the semiconductor switch unit 2110, the micro-capacitors Cb are close to the first semiconductor switch element and the second semiconductor switch element such that the parasitic inductance in the switch circuit package module 2100 is reduced. In still another embodiment, the capacitors Ca in FIG. 2 and the micro-capacitors Cb in FIG. 4 are input capacitors. Although there are advantages to integrate the input capacitors in the semiconductor switch unit 2110, the input capacitors cannot be totally integrated in the semiconductor switch unit 2110, because the capacitance of the input capacitors in the semiconductor switch unit 2110 is small, and the input capacitors in the semiconductor switch unit 2110 is expensive.

Figure 5:
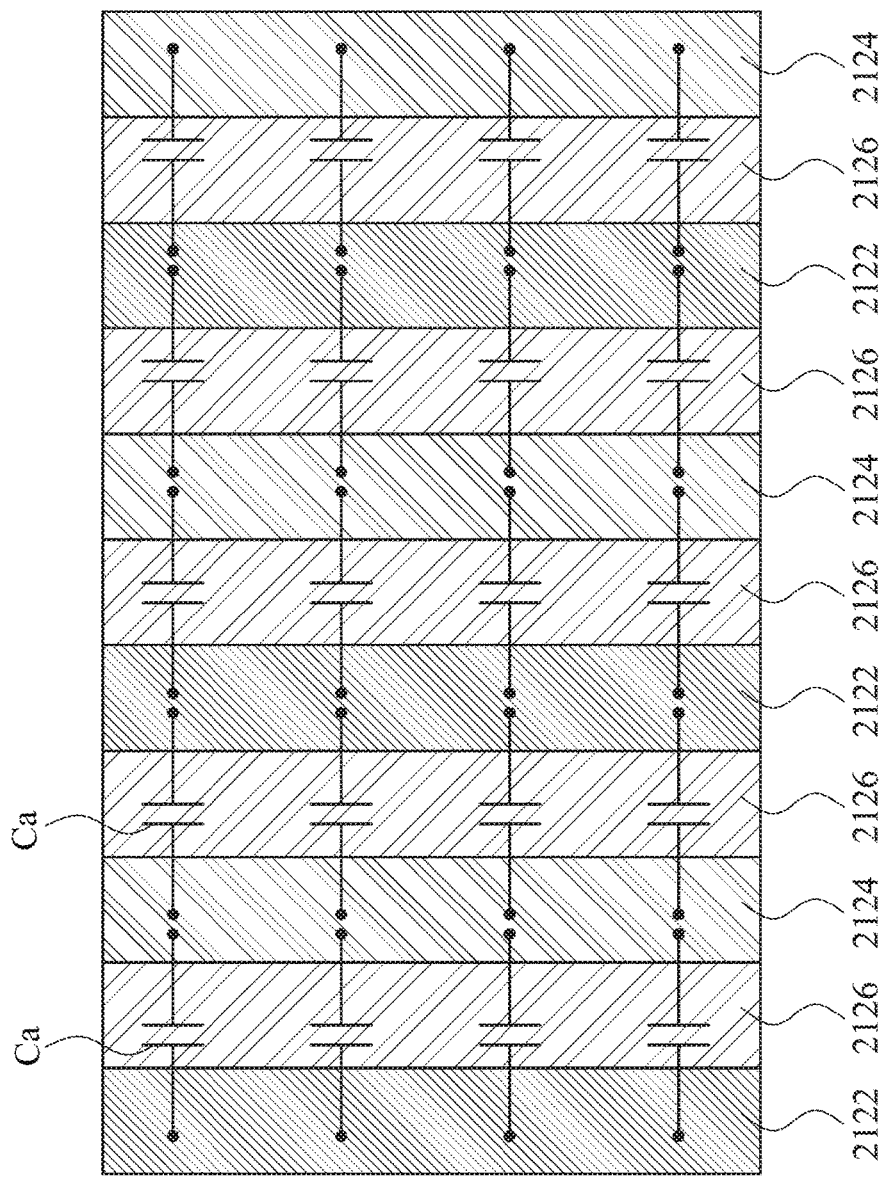
FIG. 5 is a schematic diagram of disposition relation of capacitors and electrodes of the switch circuit package module as shown in FIG. 2 according to an embodiment of the disclosure.

For facilitating the understanding of the disposition relation of capacitors Ca and the first group of pads 2122, 2124, 2126 as shown in FIG. 2, reference is now made to FIG. 5. As can be seen in the FIGS. 2, 5, each capacitor Ca comprises a first electrode and a second electrode and is stacked on surface of the redistribution layer where the second group of pads GND, VIN located at. The first electrode and the second electrode of each capacitor Ca are connected with the drain electrode of the first semiconductor switch element and source electrode of the second electrode respectively.

Figure 6:
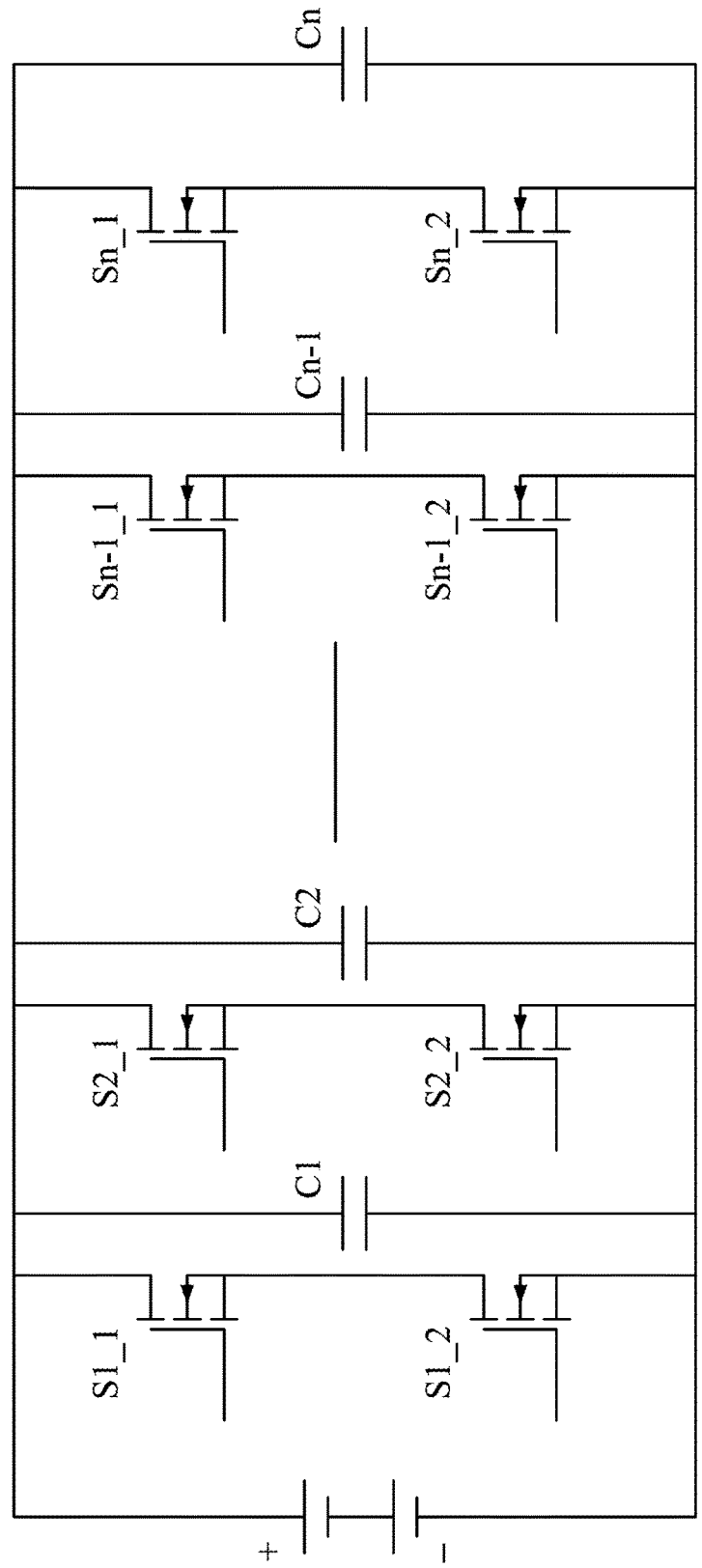
FIG. 6 is a schematic equivalent circuit diagram illustrating the switch circuit package module as shown in FIG. 2 according to an embodiment of the disclosure.

FIG. 6 is a schematic equivalent circuit diagram illustrating the switch circuit package module as shown in FIG. 2 according to an embodiment of the disclosure. Specifically, as shown in FIGS. 2 and 6, if the switch circuit package module 2100 has n capacitors (i.e., C1, C2, . . . , Cn), then the equivalent circuit shown in FIG. 6 may include n sets of paralleled equivalent sub switch circuits according to the structure shown in FIG. 2, and each set of sub switch circuits includes equivalent sub half bridge high side switches (S1_1, S2_1, . . . or Sn_1) and sub half bridge low side switches (S1_2, S2_2, . . . or Sn_2). When the above-mentioned n sets of paralleled equivalent sub switch circuits are operated according to the gate drive signal, compared to the commutation loop of the original switch circuit with the external capacitor module, the commutation loops of the n sets of paralleled equivalent sub switch circuits are shortened to 1/n.

Figure 7:
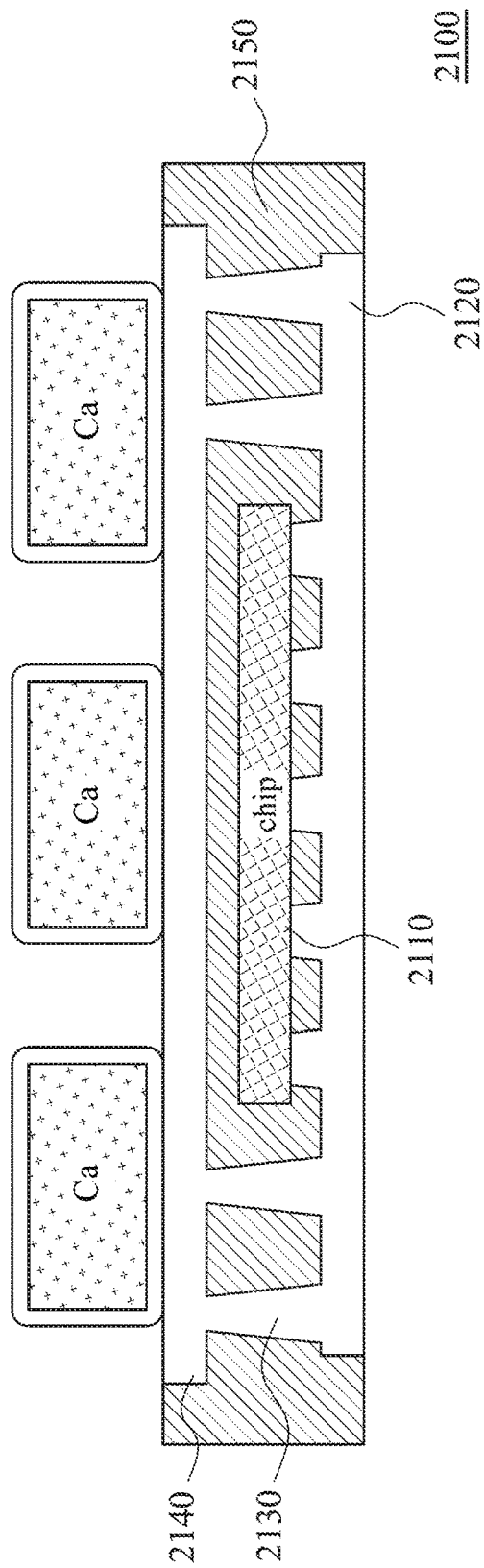
FIG. 7 is a schematic cross-section diagram of the switch circuit package module as shown in FIG. 2 according to an embodiment of the disclosure.

FIG. 7 is a schematic cross-section diagram of the switch circuit package module as shown in FIG. 2 according to an embodiment of the disclosure. It is noted that the cross-section diagram of the switch circuit package module in FIG. 7 is a cross-section diagram taken along line AA' in FIG. 2. As shown in the figure, the metal layer includes layers 2120, 2140, and the first group of pads 2122, 2124, 2126 as shown in FIG. 2 lead out the drain electrodes of the first semiconductor switch element, the source electrodes of the second semiconductor switch element and the common electrodes of the semiconductor switch unit 2110 through the metal layer. The capacitors Ca are disposed above the semiconductor switch unit 2110. In another embodiment, a driving circuit (not shown) may be integrated in the semiconductor switch unit 2110. Other details regarding the switch circuit package module 2100 are described in description of FIG. 2 and will be omitted herein for the sake of brevity.

Figure 8A:
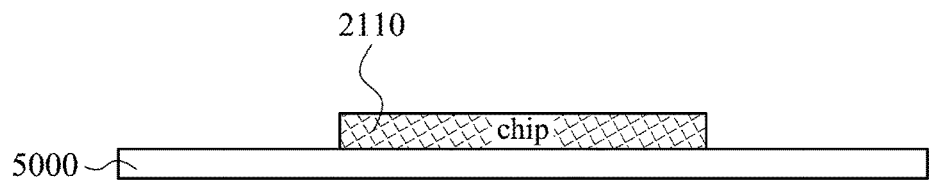
FIG. 8A is a manufacturing flow diagram of the switch circuit package module as shown in FIG. 7 according to an embodiment of the disclosure.
Figure 8B:
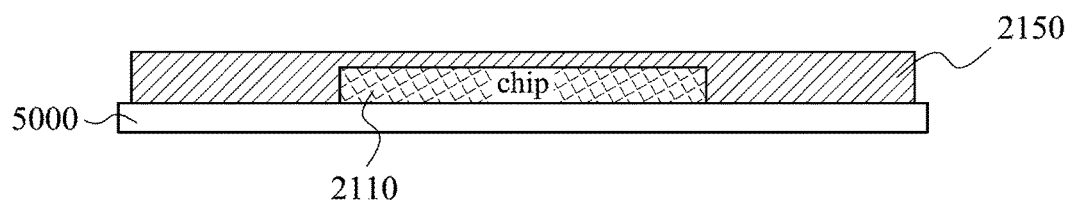
FIG. 8B is a manufacturing flow diagram of the switch circuit package module as shown in FIG. 7 according to an embodiment of the disclosure.
Figure 8C:
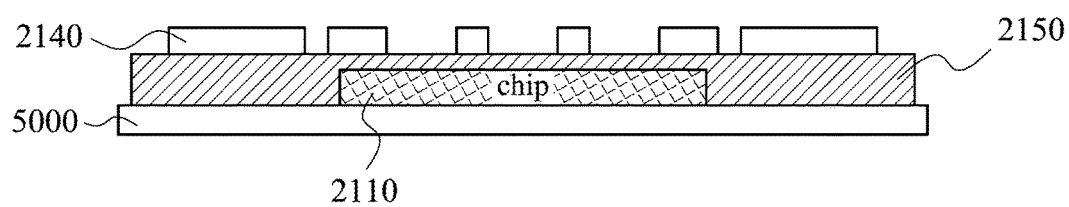
FIG. 8C is a manufacturing flow diagram of the switch circuit package module as shown in FIG. 7 according to an embodiment of the disclosure.
Figure 8D:
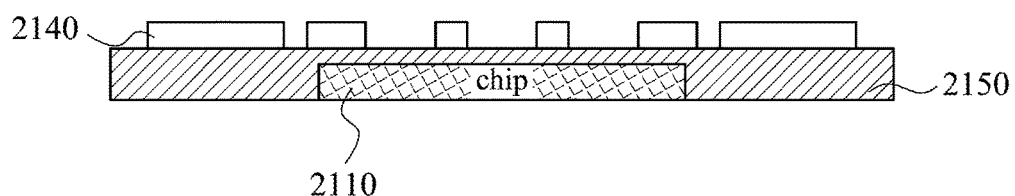
FIG. 8D is a manufacturing flow diagram of the switch circuit package module as shown in FIG. 7 according to an embodiment of the disclosure.
Figure 8E:
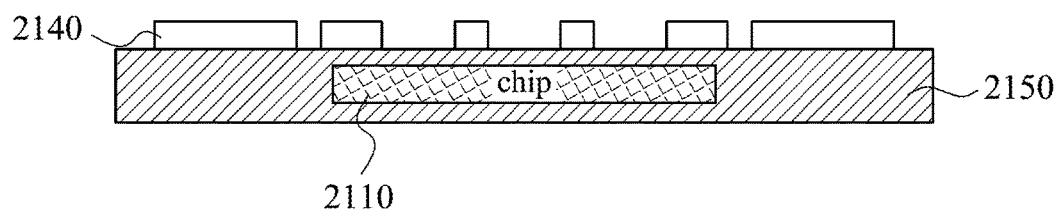
FIG. 8E is a manufacturing flow diagram of the switch circuit package module as shown in FIG. 7 according to an embodiment of the disclosure.
Figure 8F:
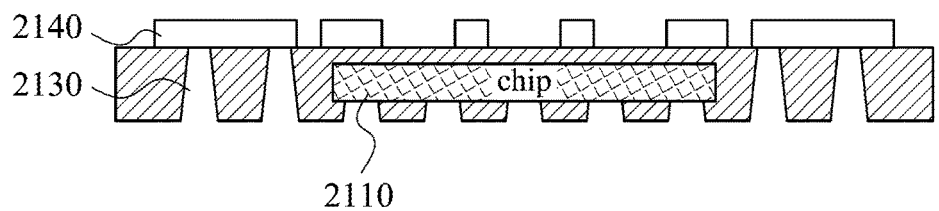
FIG. 8F is a manufacturing flow diagram of the switch circuit package module as shown in FIG. 7 according to an embodiment of the disclosure.
Figure 8G:
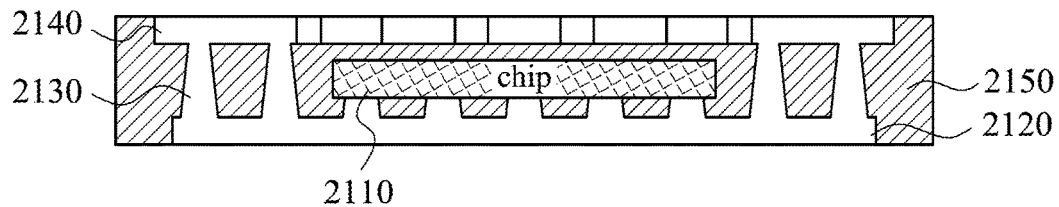
FIG. 8G is a manufacturing flow diagram of the switch circuit package module as shown in FIG. 7 according to an embodiment of the disclosure.

FIG. 8A~FIG. 8G are manufacturing flow diagrams of the switch circuit package module as shown in FIG. 7 according to an embodiment of the disclosure. As can be seen in FIG. 8A, the semiconductor switch unit 2110 is bonded on a carrier tape 5000. In FIG. 8B, a laminating process is preformed to laminate a build-up material layer 2150 on the upper surface of the semiconductor switch unit 2110. In FIG. 8C, the layer 2140 of the metal layer is formed on the upper surface of the build-up material layer 2150. In FIG. 8D, the carrier tape 5000 is removed. In FIG. 8E, a laminating process is preformed to laminate the build-up material layer 2150 on the bottom surface of the semiconductor switch unit 2110. In FIG. 8F, a laser drilling process is preformed to drill the build-up material layer 2150 for forming the vias 2130. In FIG. 8G, the layer 2120 of the metal layer is formed on the bottom surface of the build-up material layer 2150.

Figure 9:
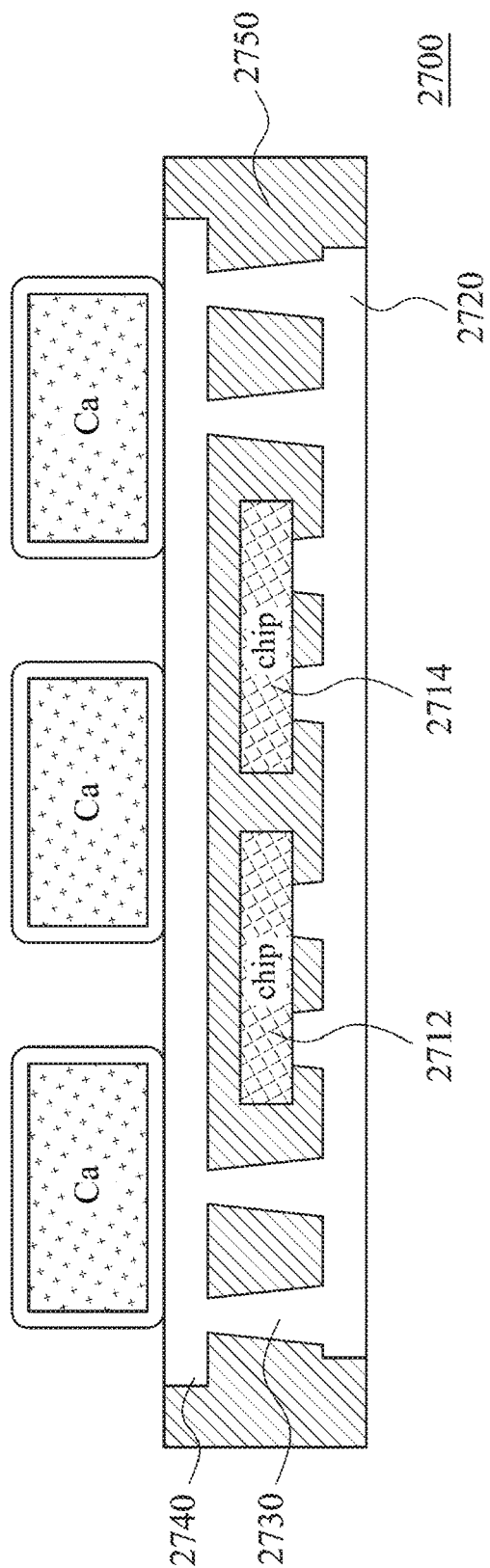
FIG. 9 is a schematic cross-section diagram illustrating a switch circuit package module according to an embodiment of the disclosure.
Figure 10:
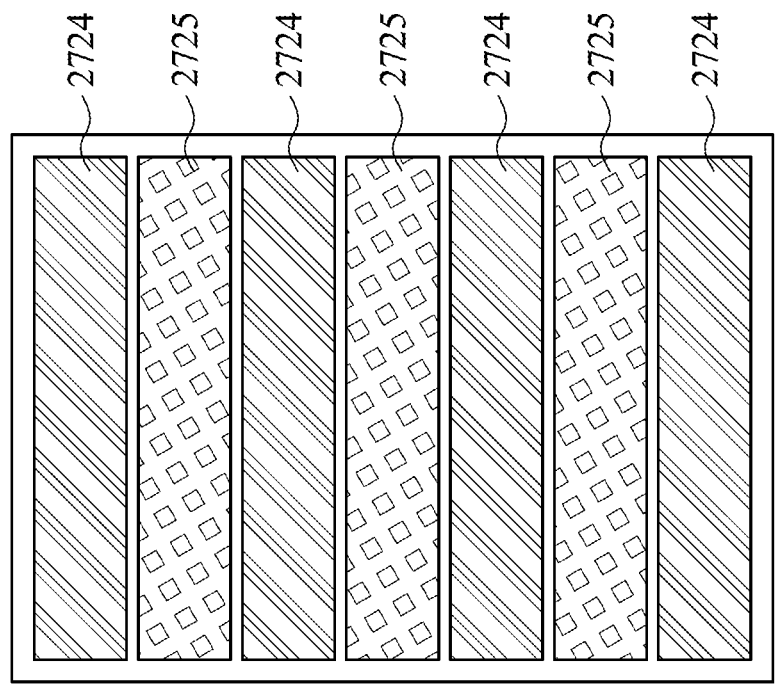
FIG. 10 is a schematic bottom diagram illustrating the switch circuit package module as shown in FIG. 9 according to an embodiment of the disclosure.
Figure 10:
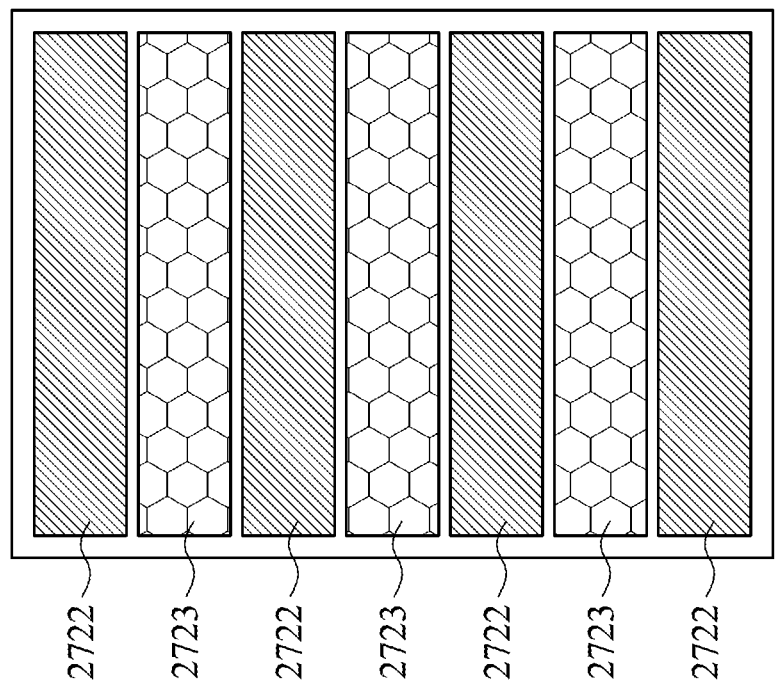

FIG. 9 is a schematic cross-section diagram illustrating a switch circuit package module according to an embodiment of the disclosure. Compared with the switch circuit package module 2100 including only one semiconductor switch unit 2110 in FIG. 7, the switch circuit package module 2700 in FIG. 9 includes two semiconductor switch units 2712, 2714. For facilitating the understanding of the difference between FIG. 7 and FIG. 9, reference is now made to FIG. 10 which is a schematic bottom diagram illustrating the switch circuit package module as shown in FIG. 9 according to an embodiment of the disclosure. As shown in FIG. 10, the right pads correspond to the first semiconductor switch element, and the left pads correspond to the second semiconductor switch element. Specifically, the right pads include pads 2724 coupled to the drain of the first semiconductor switch element and pads 2725 coupled to the source of the first semiconductor switch element, and the left pads include pads 2722 coupled to the source of the second semiconductor switch element and electrodes 2723 coupled to the drain of the second semiconductor switch element.

In one embodiment, the pads 2723 are coupled to the pads 2725 to form common pads. Of the left pads, the pads are arranged in an order of the pad 2722, the common pad 2723, the pad 2722, the common pad 2723, and so on. Of the right pads, the pads are arranged in an order of the pad 2724, the common pad 2725, the pad 2724, the common pad 2725, and so on. It is clearly that the common pads 2723, 2725 are disposed adjacent to the pad 2722 or the pad 2724. The switch circuit package module 2700 employing the disposition of the pads 2722~2725 can enhanced electrical performance. In another embodiment, the pads 2722~2725 are disposed on one side of the semiconductor switch units 2712, 2714, and the capacitors Ca are disposed on another side of the semiconductor switch units 2712, 2714.

Figure 11:
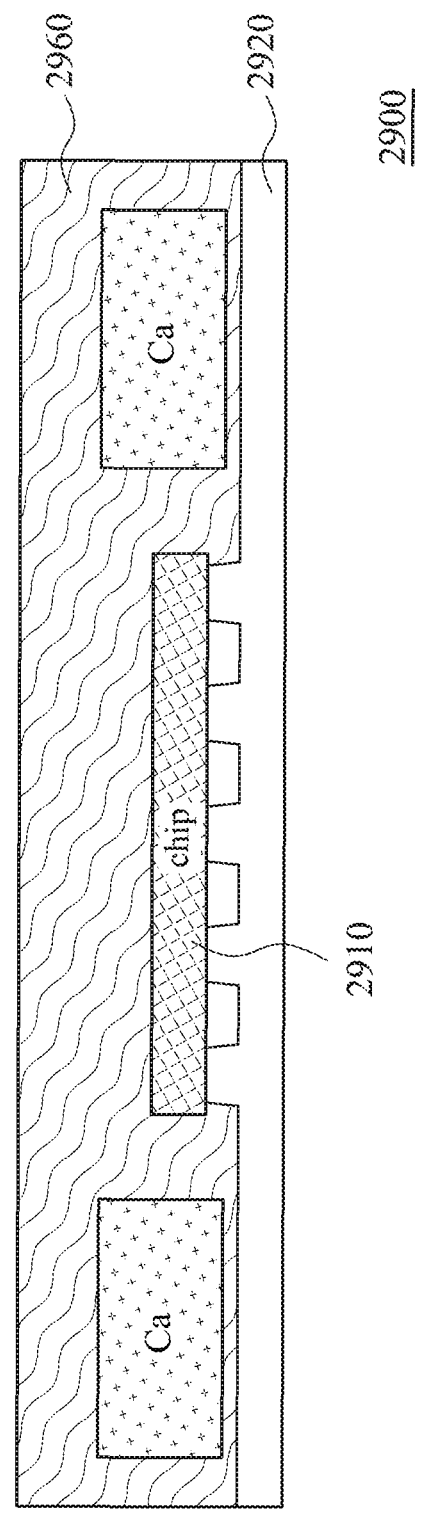
FIG. 11 is a schematic cross-section diagram illustrating a switch circuit package module according to a nineteenth embodiment of the disclosure.

FIG. 11 is a schematic cross-section diagram illustrating a switch circuit package module according to an embodiment of the disclosure. Compared with the switch circuit package module 2100 of FIG. 7, the capacitors Ca of the switch circuit package module 2900 in FIG. 11 are in symmetrical distribution with respect to the semiconductor switch unit 2910 (i.e., the capacitors Ca of the switch circuit package module 2900 in FIG. 11 are disposed on lateral sides of the chip 2910). In another embodiment, the switch circuit package module 2900 further includes a metal layer 2920, a molding material layer 2960, and a number of pads. The metal layer 2920 connects two electrodes of each capacitor Ca with a drain electrode of the first semiconductor switch element and a source electrode of the second semiconductor switch element respectively. The molding material layer 2960 encapsulates the semiconductor switch unit 2910 and the capacitor unit. The pads lead out drain electrodes of the first semiconductor switch element, source electrodes of the second semiconductor switch element and common electrodes of the semiconductor switch unit 2910 through the metal layer 2920.

In still another embodiment, the molding material layer 2960 is a plastic packaging material layer 2960. Since the switch circuit package module 2900 employs the plastic packaging material layer 2960, the manufacturing process of the switch circuit package module 2900 of FIG. 11 is easier than that of the switch circuit package module 2100 of FIG. 7 employing the build-up material layer 2150.

Figure 12:
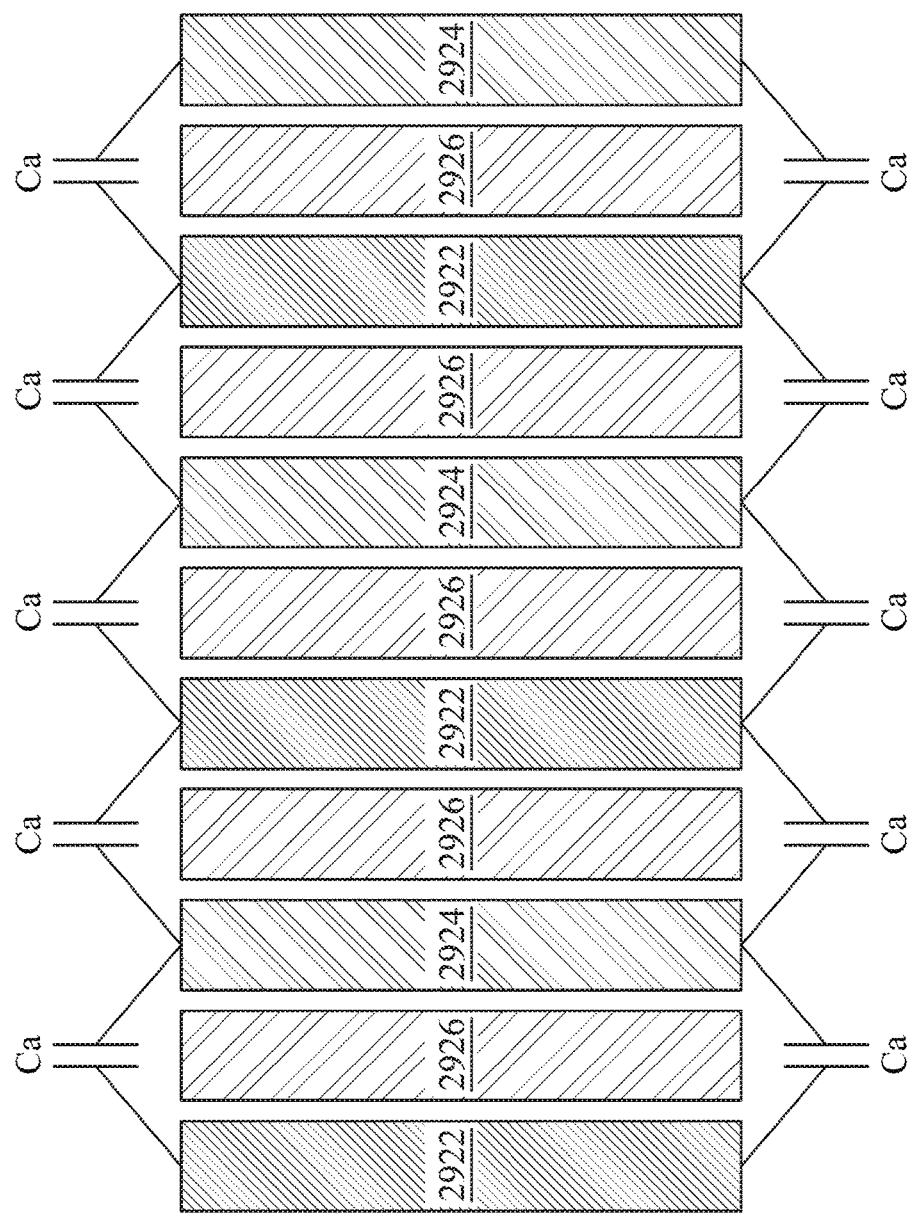
FIG. 12 is a schematic bottom diagram illustrating the switch circuit package module as shown in FIG. 11 according to an embodiment of the disclosure.

For facilitating the understanding of the structure of the switch circuit package module 2900, reference is now made to FIG. 12 which is a schematic bottom diagram illustrating the switch circuit package module 2900 as shown in FIG. 11 according to an embodiment of the disclosure. As shown in FIG. 12, the pads 2924 are coupled to the drain of the first semiconductor switch element, the common pads 2926 are coupled to the drain of the second semiconductor switch element and the source of the first semiconductor switch element, and the pads 2922 are coupled to the source of the second semiconductor switch element. The capacitor Ca comprises a first electrode and a second electrode. The first electrode of the capacitor Ca is coupled to the pad 2922, and the second electrode of the capacitor Ca is coupled to the pad 2924.

Figure 13:
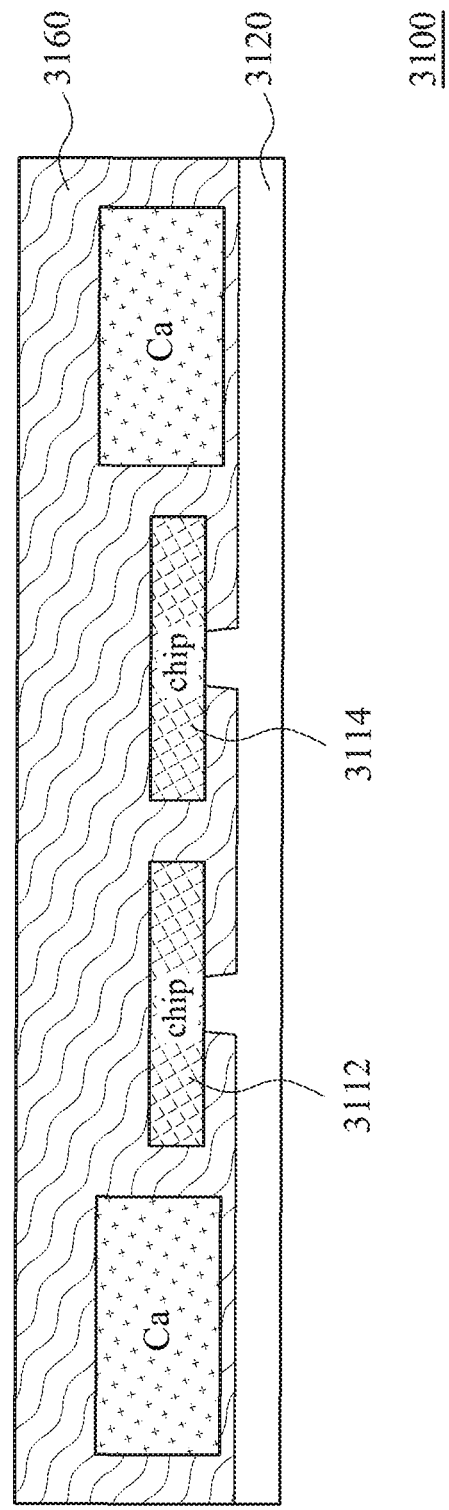
FIG. 13 is a schematic cross-section diagram illustrating a switch circuit package module according to a twentieth embodiment of the disclosure.

FIG. 13 is a schematic cross-section diagram illustrating a switch circuit package module according to an embodiment of the disclosure. Compared with the switch circuit package module 2900 including only one semiconductor switch unit in FIG. 11, the switch circuit package module 3100 in FIG. 13 includes two semiconductor switch units 3112, 3114. The disposition of pads in FIG. 13 is similar to that of the pads 2722~2725 in FIG. 10, and the connection among the capacitors Ca and pads in FIG. 13 is similar to that among the capacitors Ca and pads in FIG. 12; therefore, a detailed description regarding the pads and the connection among the capacitors Ca and pads in FIG. 31 is omitted herein for the sake of brevity.

The sequence of all steps mentioned in this embodiment can be adjusted according to the actual requirements and they can even be performed simultaneously or partially simultaneously, except expressly specified otherwise in the above embodiment. The above is only an embodiment and is not intended to limit the disclosure.

Although the disclosure has been disclosed with reference to the above embodiments, these embodiments are not intended to limit the disclosure. It will be apparent to those of skills in the art that various modifications and variations can be made without departing from the spirit and scope of the disclosure. Therefore, the scope of the disclosure should be defined by the appended claims.

What is claimed is:

1. A switch circuit package module, comprising:
   at least a semiconductor switch unit comprising:
      a first semiconductor switch element comprising a plurality of parallel connected sub micro-switch elements, each sub micro-switch element configured with a drain electrode and a source electrode; and
      a second semiconductor switch element comprising a plurality of parallel connected sub micro-switch elements, each sub micro-switch element configured with a drain electrode and a source electrode; and
   at least a capacitor unit comprising a plurality of capacitors;
   wherein the semiconductor switch unit comprises a plurality of common electrodes, each common electrode connects the source electrode of one sub micro-switch element in the first semiconductor switch element with the drain electrode of one sub micro-switch element in the second semiconductor switch element and is disposed adjacent to at least one drain electrode from the first semiconductor switch element or one source electrode from the second semiconductor switch element, such that when the capacitors are configured to cooperate with the sub micro-switch element of the first semiconductor switch element or the second semiconductor switch element, impedances of multiple commutation loops between the capacitors and the sub micro-switch element are close to or the same with each other;
   wherein the semiconductor switch unit is a one integral chip, the first semiconductor switch element and the second semiconductor switch element are integrated into the one integral chip, the integral chip further comprises a plurality of capacitors integrated in, and each capacitor comprises two electrodes; the two electrodes of each capacitors are electrically connected with a drain electrode of the first semiconductor switch element and a source electrode of the second semiconductor switch element respectively.

2. A switch circuit package module, comprising:
   at least a semiconductor switch unit comprising:
      a first semiconductor switch element comprising a plurality of parallel connected sub micro-switch elements, each sub micro-switch element configured with a drain electrode and a source electrode; and
      a second semiconductor switch element comprising a plurality of parallel connected sub micro-switch elements, each sub micro-switch element configured with a drain electrode and a source electrode; and
   at least a capacitor unit comprising a plurality of capacitors;
   wherein the semiconductor switch unit comprises a plurality of common electrodes, each common electrode connects the source electrode of one sub micro-switch element in the first semiconductor switch element with the drain electrode of one sub micro-switch element in the second semiconductor switch element and is disposed adjacent to at least one drain electrode from the first semiconductor switch element or one source electrode from the second semiconductor switch element, such that when the capacitors are configured to cooperate with the sub micro-switch element of the first semiconductor switch element or the second semiconductor switch element, impedances of multiple commutation loops between the capacitors and the sub micro-switch element are close to or the same with each other;
   the switch circuit package module further comprising:
   a metal layer connected two electrodes of each capacitor with a drain electrode of the first semiconductor switch element and a source electrode of the second semiconductor switch element respectively;
   a molding material layer encapsulated the semiconductor switch unit and the capacitor unit; and
   a number of pads leading out drain electrodes of the first semiconductor switch element, source electrodes of the second semiconductor switch element and common electrodes of the semiconductor switch unit through the metal layer.

3. The switch circuit package module of claim 2, wherein the plurality of capacitors are in symmetrical distribution with respect to the semiconductor switch unit.

* * * * *